US005960333A

United States Patent [19]

Repke et al.

[11] Patent Number: 5,960,333

[45] Date of Patent: Sep. 28, 1999

[54] CIRCUITRY AND METHOD FOR POWER CALIBRATION

[75] Inventors: Joe Repke, Apex, N.C.; Cornelius Adrianus Henricus Maria Van Puijenbroek, Onlandhorst, Netherlands

[73] Assignee: Ericsson Inc., Research Triangle Park, N.C.

[21] Appl. No.: 08/829,203

[22] Filed: Mar. 31, 1997

[51] Int. Cl.[6] .............................. H04B 1/02; H03G 3/20; H04K 1/02

[52] U.S. Cl. ............................ 455/91; 455/126; 455/127; 455/116; 330/137; 330/279; 375/297; 375/312

[58] Field of Search .................................... 455/126, 127, 455/116, 115, 91; 330/137, 279, 127, 129; 375/297, 312

[56] References Cited

U.S. PATENT DOCUMENTS

| | | | |
|---|---|---|---|
| 4,841,301 | 6/1989 | Ichihara | 341/126 |
| 5,196,806 | 3/1993 | Ichihara | 330/137 |
| 5,371,473 | 6/1994 | Trinh et al. | 330/129 |
| 5,423,081 | 6/1995 | Thiele et al. | 455/116 |
| 5,515,008 | 5/1996 | Ueda et al. | 330/280 |

FOREIGN PATENT DOCUMENTS

| | | |
|---|---|---|
| 0 481 524 A2 | 10/1991 | European Pat. Off. . |
| 0 561 754 A1 | 3/1993 | European Pat. Off. . |
| 0 843 420 A2 | 11/1997 | European Pat. Off. . |

*Primary Examiner*—Wellington Chin
*Assistant Examiner*—Sheila Smith
*Attorney, Agent, or Firm*—Jenkens & Gilchrist

[57] ABSTRACT

A method and circuitry for improved output power level calibration/compensation/control is disclosed. A single RF detector diode is employed, to which a bias current is applied prior to applying a coupled amount of the transmitted radio frequency signal to be measured during a level calibration or automatic level control function. The initial (pre-RF) voltage out of the detector circuit is stored and later subtracted from the detector's output voltage after application of the RF signal. This results in a voltage proportional only to the detected RF signal, independent of any circuit-dependent voltages and variations due to environmental conditions such as temperature fluctuation, and allowing precise control of the output power levels.

23 Claims, 3 Drawing Sheets

CIRCUITRY AND METHOD FOR POWER CALIBRATION

BACKGROUND OF THE PRESENT INVENTION

1. Field of the Invention

The present invention relates generally to the field of wireless communications, particularly, to an improved circuitry configuration and method for power calibration in a Time Division Multiple Access (TDMA) or Time Division Duplex (TDD) system, and, more particularly, to an improved circuitry configuration for performing radio frequency power measurement calibrations in TDMA, TDD and other systems and methods using the same.

2. Background and Objects of the Present Invention

The evolution of wireless communication over the past century, since Guglielmo Marconi's 1897 demonstration of radio's ability to provide continuous contact with ships sailing the English Channel, has been remarkable. Since Marconi's discovery, new wireline and wireless communication methods, services and standards have been adopted by people throughout the world. This evolution has been accelerating, particularly over the last ten years, during which the mobile radio communications industry has grown by orders of magnitude, fueled by numerous technological advances that have made portable radio equipment smaller, cheaper and more reliable. The exponential growth of mobile telephony will continue to rise in the coming decades as well, as this wireless network interacts with and eventually overtakes the existing wireline networks.

A growing number of wireless communications systems use Time Division Multiple Access (TDMA), in which multiple users share frequency spectrum by transmitting and receiving bursts of information only during each user's specific timeslot, as assigned by the system. These transceivers can simultaneously receive and transmit without difficulty, since the receive and transmit frequency bands are separated sufficiently. Time Division Duplex (TDD) takes TDMA one step further in that a particular timeslot structure is broken down further into uplink-only and downlink-only timeslots, i.e., a transceiver is only performing one task or the other at a particular time.

It is, in general, advantageous for any communications link to utilize as strong a signal as costs allow to both improve signal quality, i.e., achieve a higher signal-to-noise ratio, and to provide sufficient coverage or range (distance). However in most situations, limits are imposed by authorities, i.e., the Federal Communications Commission, upon the transmitted RF power of such systems in order to prevent one or more powerful signals from interfering with other users of the RF spectrum. Additional restrictions may be self-imposed by a system in order to minimize interference amongst its own subscribers.

Accordingly, it can be important to control an RF transmitter's output power level as tightly as possible towards a maximum limit without exceeding it.

A preferred way to maintain the aforementioned output power level window is through use of Automatic Level Control circuitry (ALC), in which the transmitter's output power level is monitored and feedback techniques are used to generate a control signal to adjust the output power to the prescribed level. One such ALC is described in U.S. Pat. No. 4,523,155 to Walczak et al. Another is described in a book entitled *Analog Automatic Control Loops in Radar and EW* by Richard Smith Hughes (Artech House, 1988). A great difficulty in these approaches, however, one which the present invention seeks to solve, is obtaining an accurate measure of the RF output power level over varying environmental conditions, especially temperature, as will be described hereinafter.

With reference now to FIG. 1 there is shown a conventional ALC, such as used in the aforementioned Hughes text, where a modulated RF signal is amplified by an amplifier 10. The amplified output then passes through an RF coupler 12, an RF isolator 14 and a filter 16 to an antenna 18 for transmission in a conventional manner.

A portion of the amplified output signal, however, is diverted via coupler 12 and connected through a capacitor 20 to a (biased) detector diode 22, which along with a second capacitor 24 forms a conventional envelope detector. The diverted, detected output is then passed (through a resistor 26) to the plus input of an amplifier 28.

In an effort to increase detection sensitivity, the detector diode 22 is often biased with a small amount of current, such as from a DC source 30 across a resistor 32, to increase the sensitivity of the detection circuitry by lowering the dynamic resistance of the diode 22. This bias current, however, creates a forward voltage ($Vf_{DC}$) across the diode junction, which is significantly temperature dependent. The resulting voltage at the output of diode 22 is then a function of $Vf_{DC}+V_{RF}$, i.e., the sum of the DC forward voltage and the signal voltage ($V_{RF}$). As noted, one serious problem affecting performance of this circuitry is the temperature dependance of the diode 22 voltage, which being approximately 2 mV/°C. could constitute a significant portion of the above sum. Accordingly, some means to compensate for this effect is usually necessary to improve system performance.

A previously-used and common solution to the aforementioned temperature variation problem is to similarly bias a second or compensating diode 34, also illustrated in FIG. 1, and apply the voltage from this compensating diode 34 to the opposite terminal of a conventional difference amplifier, such as the aforementioned amplifier 28. In this manner, the variation in the DC voltage across the detector diode 22 is substantially negated by similar variations in the compensating diode 34. The gain of the compensating half of the circuit is then determined by the combination of resistive division supplied by a pair of resistors 38 and 40 in conjunction with a feedback resistor 42, as is the gain to the detected signal determined by the same feedback resistor 42 in combination with the resistive divider formed by resistors 26 and 27.

It has been generally thought, e.g., in U.S. Pat. No. 4,523,155 and in the Hughes text, that by use of this compensating diode 34 the deleterious effects of temperature variation may be eliminated. However, although this approach may ameliorate some of the temperature variation problems, it is not a panacea, and variations problems remain, e.g., due to diode-to-diode variation and imperfections in the semiconductor manufacturing process, such as differences in diode junction areas, contact potentials, geometries, emission coefficients, etc. There are also differences caused by variable environmental factors due, for example, to temperature, humidity, component aging and power supply voltage fluctuations which add to the degradation in performance. Thus, a new approach is needed to solve the aforedescribed temperature and other variance difficulties of the prior art calibration circuitry.

Additionally, alternative efforts to better control the aforementioned temperature variation problems and diode-to-diode variations involve stringent component requirements on greater numbers of components used, e.g., in controlling the diode bias current, which can prohibitively drive up overall system costs.

Accordingly, in view of the aforementioned discussion, it is an object of the present invention to provide a simpler solution to the problems of temperature and diode variations, while maintaining the output power levels at or near the maximum allowed level without exceeding, for example, an FCC limit.

It is a further object of the present invention that the aforementioned simpler solution lessen the stringent requirements on diode and other component specifications, as well as reduce the number of discrete components, thereby further reducing costs.

SUMMARY OF THE INVENTION

The present invention is directed to a method and circuitry for improved output power level calibration/compensation/control. A single RF detector diode is employed, to which a bias current is applied prior to applying a coupled amount of the transmitted radio frequency signal to be measured during a level calibration or automatic level control function. The initial (pre-RF) voltage out of the detector circuit is stored, to be subtracted from the detector's output voltage during and after application of the RF signal. This results in a voltage proportional only to the detected RF signal, having removed a forward voltage of the biased detector diode and any other circuit-dependent voltages.

A more complete appreciation of the present invention and the scope thereof can be obtained from the accompanying drawings which are briefly summarized below, the following detailed description of the presently-preferred embodiment of the invention, and the appended claims.

DETAILED DESCRIPTION OF THE PRESENTLY PREFERRED EXEMPLARY EMBODIMENT

Figure 1:
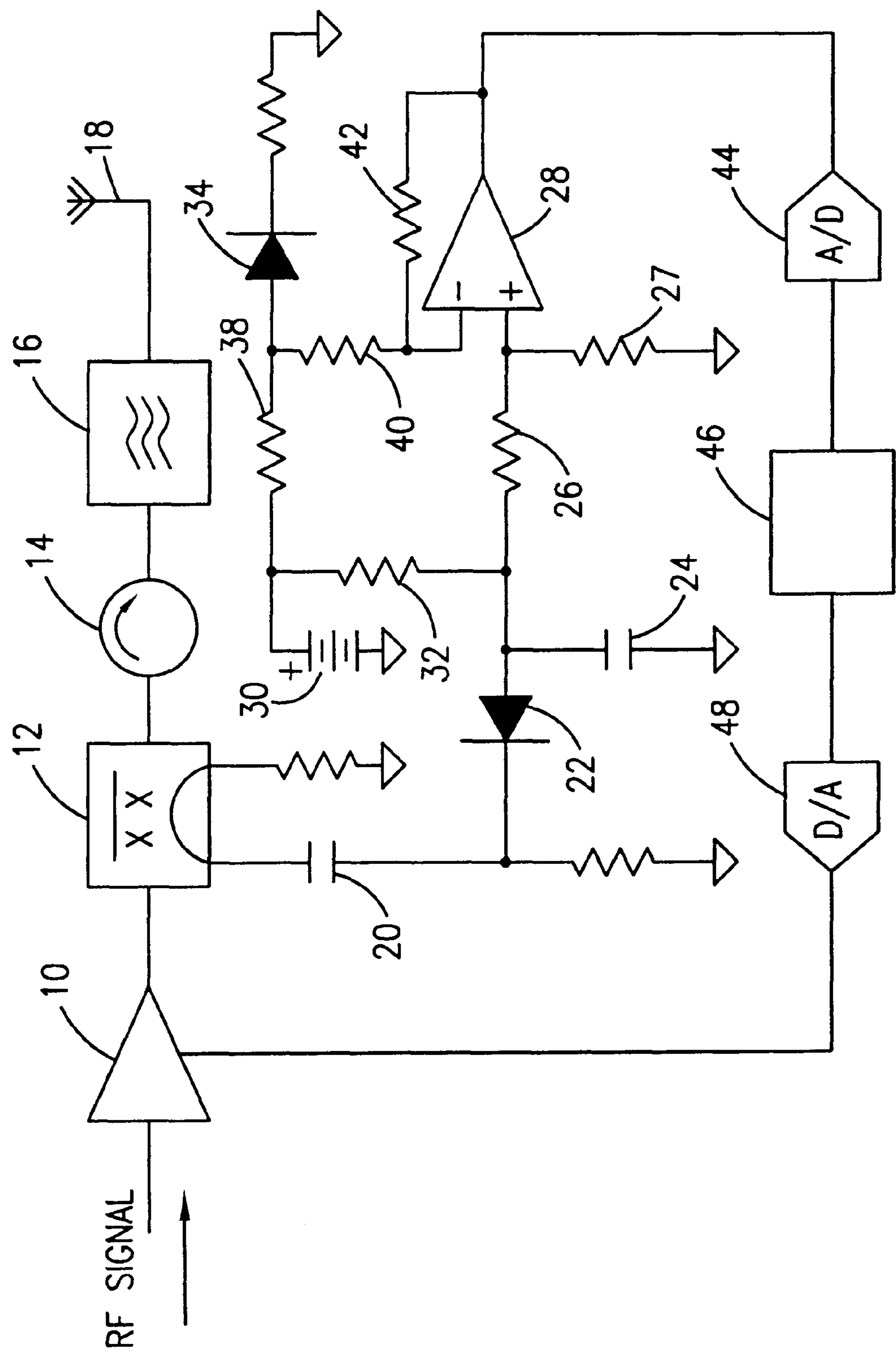
FIG. 1 is a schematic diagram of a conventional circuit for RF power output calibration.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As discussed in connection with FIG. 1, a portion of a modulated RF signal is diverted from the transmission stream and sent through the detector diode 22 to the inputs of amplifier 28, which outputs an analog signal to an A/D converter 44. The digital signal produced therefrom is forwarded to a digital processor 46, which determines an appropriate control signal based upon the detected level of an analog signal from the amplifier 28. The aforesaid control signal is then translated to analog form in a D/A converter 48, and the analog control signal is forwarded back to amplifier 10. In the aforedescribed feedback manner, the output level of amplifier 10 and, consequently, the transmission power level of the RF signal is controlled. However, as described, differences in diode materials, configurations and tolerances, and variations in environmental conditions cause inaccuracies in the transmitter output power level, resulting, for example, in sacrificed power in margin allocation to avoid exceeding allowable levels.

Figure 2:
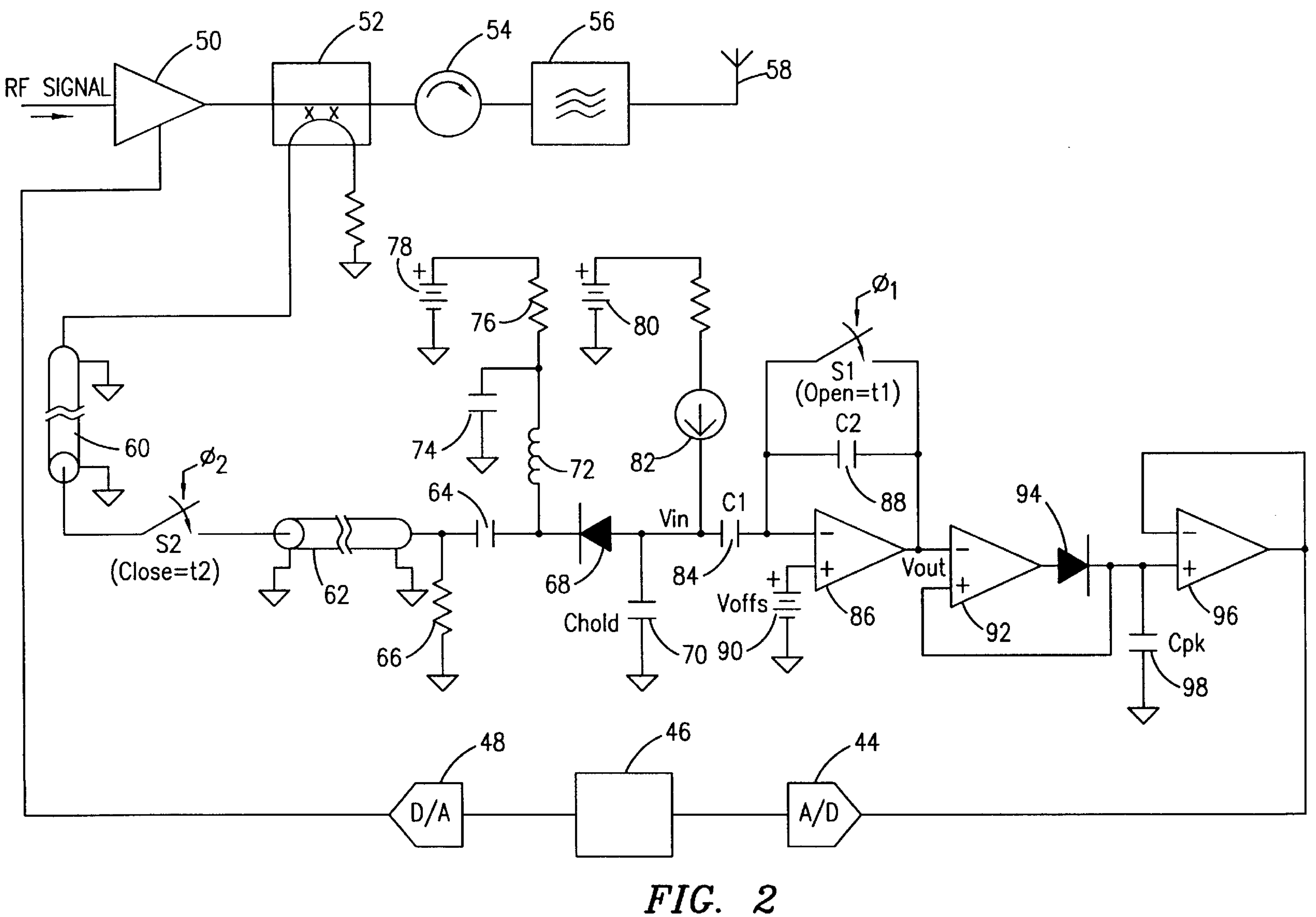
FIG. 2 is a schematic diagram of a presently preferred embodiment of the improved RF power output calibration circuitry of the present invention.

With reference now to FIG. 2 there is shown a circuit diagram illustrating a preferred embodiment of the present invention for calibrating detected RF power levels in a telecommunications system. The modulated RF signals in question are, as described in connection with FIG. 1, generated in a conventional manner and pass through an amplifier 50, RF coupler 52, RF isolator 54 and RF filter 56 on the way to antenna 58, which transmits the aforementioned modulated RF signals in a conventional manner.

As discussed, a portion of the modulated RF signal is diverted or funneled out of the transmission stream, e.g., the diverted portion is preferably less than −10 dB, more preferably within the range of −10 to −40 dB, and most preferably within the range of −15 to −20 dB. The remainder of the signal in the transmission stream is sent to the antenna 58, as described hereinabove. The signal stream portion diverted from the transmission stream passes over a conventional transmission line 60 to a switch S2, which is generally omitted in TDMA or TDD systems and usually employed only in non-TDMA systems. Switch S2, when employed, is controlled with a timing signal $\Phi_2$, and remains open until a time t2, as will be discussed in more detail hereinafter. The signal stream portion then travels over a second transmission line 62 to a capacitor 64. It should be understood, however, that capacitor 64 may instead be tied directly to a transmission line between amplifier 50 and isolator 54, serving as a coupling mechanism instead of coupler 52. In any event, as will be discussed hereinafter, capacitor 64 is also referred to as a DC blocking capacitor, isolating the DC current flow from a resistor 66 which terminates the transmission line 62.

Capacitor 64 is connected to a detector diode 68, e.g., a Schottky diode, which rectifies the RF signal in a conventional manner. As will be described more fully hereinafter, a hold capacitor 70 retains the peak voltage of the rectified signal as a stored charge. Between capacitor 64 and detector diode 68 is a connection to an inductor 72, which it should be understood presents a DC/video return for diode 68 during envelope detection rectification. A capacitor 74, a resistor 76 and a voltage source 78 are also shown in the preferred embodiment accompanying inductor 72 as part of the biasing circuitry necessary to present an appropriate DC bias level, for example, at the input of an Application Specific Integrated Circuit (ASIC) embodiment of the present invention.

Also illustrated is another DC biasing component or source 80, which, along with a current source 82, forward biases diode 68 to a nominal DC current, e.g., about 50 or 100 $\mu$A. In general, a DC bias current through diode 68 provides some benefits. First, by biasing the diode 68 to a forward voltage beyond its contact potential, the dynamic resistance is decreased, which enables smaller levels of RF voltage to be observed at the "output" of the detector. Below this contact potential, the dynamic resistance is very large (e.g., >10's of kiloOhms) and very highly temperature dependent. Second, from a larger-signal standpoint, the lower dynamic resistance maximizes the detected voltage across the detector's load, which in the case of the preferred embodiment is the hold capacitor 70.

It should be noted here that in most detector applications a resistive load (not shown) is also present which forms a resistive divider with the dynamic resistance of the diode. This resistor load is normally situated in parallel with the hold capacitor 70 and is used as a discharge (or in the present embodiment's polarity, a re-charge) path for the capacitor during the moments that the diode 68 is reverse biased. The resistor load's value is selected in conjunction with the value of capacitor 70 to provide a time constant long compared to the period of the radio frequency signal being detected (so as to avoid discharging the capacitor when the detector diode 68 is reverse-biased, yet short enough such that the contour of the RF envelope may be followed.) In the embodiment of the present invention illustrated in FIG. 2, instead of using the aforedescribed resistive load, the current source 82 provides this discharge (re-charge) source, as well as providing the diode bias current.

Also illustrated in FIG. 2 is another capacitor 84 (the capacitance of which is represented by C1), the left terminal or side of which is charged by the fixed voltage of the hold capacitor 70. The right, opposite side of capacitor 84 is connected to the inverting (−) terminal of an operational amplifier (op amp) 86. Connected as a feedback path from the op amp 86 output to the inverting terminal is another capacitor 88 (the capacitance of which is represented by C2) in parallel with a switch S1. Switch S1 is controlled with a timing signal $\Phi_1$ such that immediately upon powering up of the circuit and until the DC current flow stabilizes, switch S1 remains closed, thus short-circuiting capacitor 88 (C2), until a time t1 when switch S1 is opened. This forces the op amp 86 to zero out the potential difference between its input terminals via the feedback path through switch S1, thus charging the right terminal of capacitor 84 (C1) to the same voltage as applied to the op amp's 86 positive or non-inverting (+) terminal. A DC voltage source 90 having a voltage $V_{offs}$ is shown applied to the non-inverting input terminal of op amp 86. Consequently, with the inverting input terminal zeroed out as discussed hereinabove, the op amp 86 output would then become equal to $V_{offs}$. To simplify the explanation of the following analysis, however, $V_{offs}$ can be set to zero. It should be understood to those skilled in the art that for ideal CMOS rail-to-rail-capable op amps, this could be done in practice as well.

Figure 3:
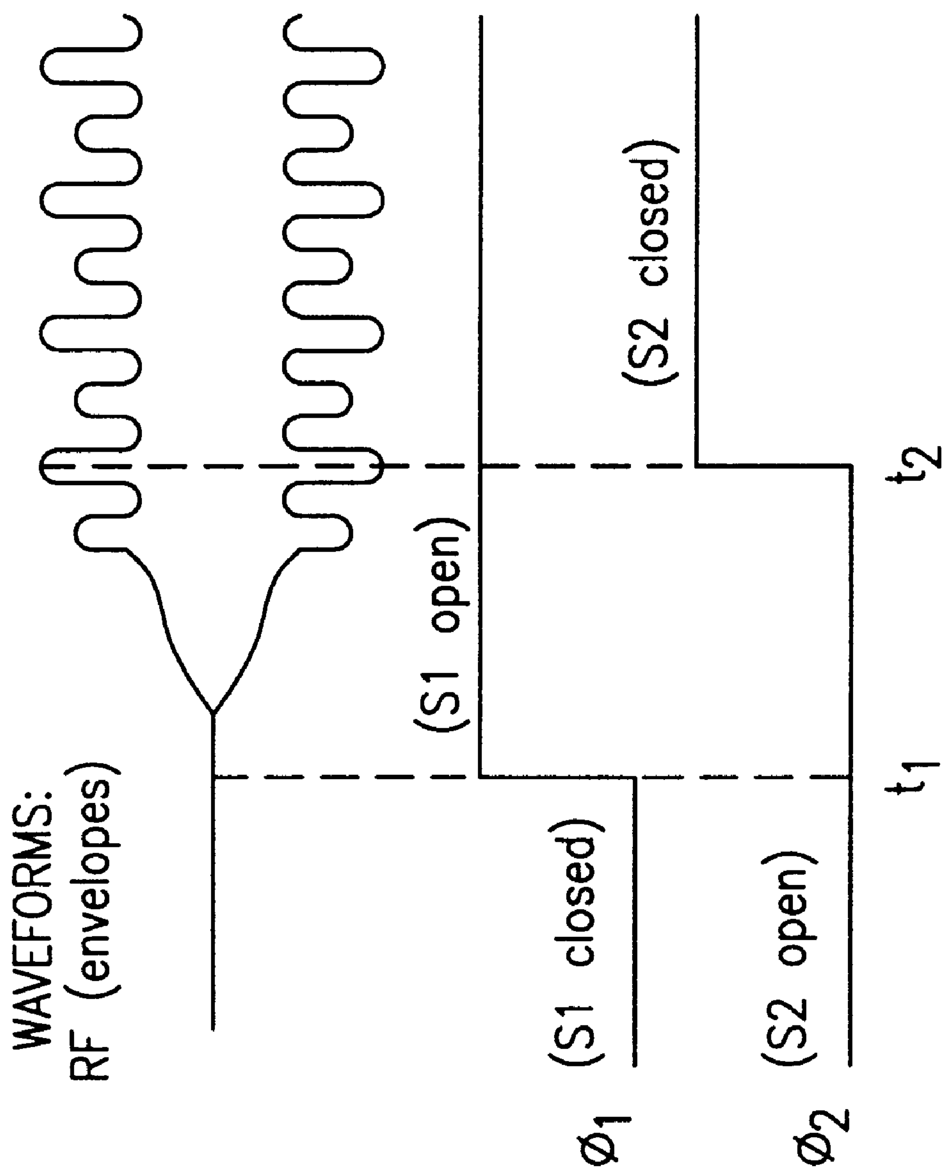
FIG. 3 is a diagram illustrating timing relationships between switch control signals and RF envelope required in accordance with the circuitry configuration of FIG. 2.

After sufficient time has passed after time t1 for the circuit voltages to settle, as also illustrated in FIG. 3, the voltage on the left side of capacitor 84 represents a calibration or reference voltage, which is analogous to the voltage provided by the subcircuit that contains the temperature-compensating diode in FIG. 1. As was discussed, this prior art diode includes the DC forward voltage of the biased detector diode 68, which is highly temperature dependent, and any other voltage sources, e.g., sources necessary to accommodate ASIC input voltage requirements. Thus, the voltage across capacitor 84 (C1) in the present embodiment is then $(V_{dc}+V_{fdiode})-V_{offs}$, where $V_{dc}$ is the summation of the applied voltage sources (78, 80), and the other obvious voltage drops throughout the DC biasing path for the detector diode 68. It should be understood that, with switch S1 closed and capacitor 88 (C2) short-circuited, the output voltage ($V_{out}$) of op amp 86 is $V_{out}=V_{offs}$.

Immediately prior to the transmission of the transmitted RF burst, such as in a TDMA or TDD system, however, switch S1 is opened, removing the short circuit around capacitor 88 (C2), across which remains a zero potential difference. As is understood in the electrical arts, any change in voltage appearing on the left side of capacitor 84 (C1), such as due to the incoming RF signal, shall result in a change in charge stored on the hold capacitor 70, and thus can be represented by an instantaneous current through capacitor 84. The value of this instantaneous current I, is governed by the following equation:

$$I = C1\cdot\frac{dV_{C1}}{dt} = C1\cdot\left(\frac{-dV_{in}}{dt}\right)$$

where $dV_{in}$ is the change in voltage at the left terminal of capacitor 84 (C1), as shown in FIG. 2, and thus the opposite sign as the voltage across capacitor 84 (C1). Since the input impedance of the amplifier 86 can be considered infinite, which is particularly true in the case of a CMOS amplifier, the same amount of instantaneous current (I) must also flow through capacitor 88 (C2). This current is sourced (or sunk, depending upon polarity) by the output ($V_{out}$) of amplifier 86, and thus imposes a change in voltage across capacitor 88 (C2) in accordance with the following relationship:

$$I = C2\cdot\frac{dV_{C2}}{dt} = C2\cdot\left(\frac{dV_{out}}{dt}\right)$$

where $dV_{C2}$ is the change in voltage across capacitor 88 (C2) and $dV_{out}$ is the change in voltage at the output of the op amp 86. Therefore, setting the right sides of the preceding equations equal, it is seen that the relationship between $dV_{out}$ and $dV_{in}$ is:

$$\frac{dV_{out}}{dV_{in}} = \frac{-C1}{C2}$$

Thus, any voltage change across capacitor 70 ($C_{hold}$) is amplified in the aforedescribed manner by the factor $$\frac{-C1}{C2},$$

and is independent of any DC voltages, most importantly the forward voltage of diode 68.

Another way to describe the aforementioned voltage changes is from a charge standpoint, where after opening switch S1 any change in charge across C1 due to voltage changing on its left terminal from rectified RF must equally occur across C2 as well in order to maintain zero potential between the negative (inverting) and positive (non-inverting) input terminals of op amp 86. Since charge (Q) across a capacitor equals capacitance (C) times voltage (V), then $\Delta Q = C1\cdot\Delta V_{C1} = C2\cdot\Delta V_{C2}$. Since a decrease in voltage on the left terminal of C1 results in an increase in voltage across C1, and an increase in voltage across C2 results in an increase in $V_{out}$, the following relationship is the result:

$$C1\cdot(-\Delta V_{in}) = C2\cdot(\Delta V_{out})$$

and thus, $$\Delta V_{out} = -\frac{C1}{C2}\Delta V_{in}$$

The change $\Delta V_{out}$ is then a direct measurement of the detected RF signal amplified by the factor $$-\frac{C1}{C2}.$$

This ratio, especially within an integrated circuit implementation, can be made to be extremely precise and repeatable.

It should, therefore, be understood that the output voltage from amplifier 86 in the above circuit configuration is proportional purely to the change in voltage after time t1 (as shown in FIG. 3) on capacitor 70, which is solely due to the detected RF signal. Accordingly, the individual differences among diode and other circuit elements due to manufacturing tolerances and errors, temperature and other environmental factors are irrelevant, particularly because of the short period of time involved in the calibration. Unlike the circuitry and method of U.S. Pat. No. 4,523,155 and similar devices which compensate for temperature variations, e.g., by adding the second diode 34, the circuitry and method of the present invention operates entirely differently. By measuring the voltage change, from whatever voltage is present, the improved configuration of the present invention eliminates the aforementioned variations from the measurement equation, resulting in an unbiased measurement of RF peak voltage as rectified by detector diode 68, the only diode needed to perform the measurement.

With reference again to FIG. 2, since the measured voltage due to the detected RF signal will follow the RF envelope, it is preferable to follow the aforedescribed switched capacitor amplifier circuit with a peak-hold circuit, particularly for applications employing varying-envelope waveforms, such as II/4 Differential Quadrature Phase shift Keying (II/4-DQPSK) currently used in most TDMA systems. An operational amplifier 92 and a diode 94, as shown in FIG. 2, retain the peak in a conventional manner understood to those skilled in the art. Similarly, another amplifier 96 is preferably used to isolate a peak-hold capacitor ($C_{pk}$) 98 from the aforedescribed A/D converter 44, digital processor 46 and D/A converter 48.

As discussed hereinbefore, switch S2 may be omitted in TDMA and TDD systems, i.e., systems employing a structured transmission burst protocol, and may be incorporated in non-TDMA systems, e.g., Frequency Division Multiple Access (FDMA) or Frequency Division Duplex systems as used in the cellular telephone industry. As discussed hereinbefore, switch S2 is controlled with timing signal $\Phi_2$ such that switch S2 is open until time t2 subsequent to time t1, at which time switch S1 is opened, as described above and as also illustrated in FIG. 3.

It should be understood that the aforedescribed circuit configuration of the preferred embodiment may be implemented within an integrated circuit of a CMOS-based process, particularly, one tailored for low-voltage, single-supply portable wireless applications.

The previous description is of a preferred embodiment for implementing the invention, and the scope of the invention should not necessarily be limited by this description. The scope of the present invention is instead defined by the following claims.

What is claimed is:

1. Control circuitry in a telecommunications system for maintaining a radio frequency (RF) signal from an RF signal amplifier at a given power level, the amplification of said RF signal amplifier being proportional to an adjust signal provided by current adjust means, said current adjust means varying the magnitude of the adjust signal in response to a current control signal, said control circuitry comprising:

detection means coupled to said RF signal amplifier, said detection means maintaining an initial voltage prior to receipt of said RF signal, said detection means, after receipt of said RF signal, generating an output voltage, said output voltage comprising the sum of said initial voltage and an RF voltage generated by said RF signal;

subtraction means coupled to said detection means and said current adjust means for subtracting said initial voltage from said output voltage, whereby said current control signal represents said RF voltage; and a hold capacitor attached to the connection between said detector diode and said subtraction means.

2. The control circuitry according to claim 1 wherein said detection means comprises:

a detector diode, a first capacitor connected to said RF signal amplifier and said detector diode; and a first bias means for biasing said detector diode and maintaining said initial voltage, said first bias means attached to the connection between said first capacitor and said detector diode.

3. The control circuitry according to claim 2, wherein said first bias means comprises:

a first voltage source.

4. The control circuitry according to claim 3, wherein said first bias means further comprises:

an inductor connected to said first voltage source and the connection between said first capacitor and said detector diode.

5. The control circuitry according to claim 4, wherein said first bias means further comprises:

a capacitor attached to the connection between said first voltage source and said inductor.

6. The control circuitry according to claim 1, wherein said detection means comprises:

a detector diode;

a second capacitor connected to said detector diode and said subtraction means; and a second bias means for biasing said detector diode and maintaining said initial voltage, said second bias means attached to the connection between said detector diode and said second capacitor.

7. The control circuitry according to claim 6, wherein said second bias means comprises:

a second voltage source.

8. The control circuitry according to claim 7, wherein said second bias means further comprises:

a current source, connected to said second voltage source and the connection between said detector diode and said second capacitor.

9. The control circuitry according to claim 1, wherein said subtraction means comprises:

an amplifier having an inverting input and a non-inverting input, said detection means connected to said inverting input of said amplifier.

10. The control circuitry according to claim 9, wherein said subtract means further comprises:

a third voltage source connected to said non-inverting input of said amplifier.

11. The control circuitry according to claim 9, wherein said subtract means further comprises:

a third capacitor connected to said inverting input of said amplifier and an output of said amplifier; and a switch in parallel with said third capacitor, said switch when closed short-circuiting said third capacitor, and said switch being opened prior to the receipt of said RF signal.

12. The control circuitry according to claim 1, wherein said detection means comprises:

a detector diode, a first capacitor connected to said RF signal amplifier and said detector diode, a first voltage source for biasing said detector diode and maintaining said initial voltage, said first voltage source attached to the connection between said first capacitor and said detector diode, a second capacitor, connected to said detector diode and said subtraction means, a second voltage source for biasing said detector diode and maintaining said initial voltage, said second voltage source attached to the connection between said detector diode and said second capacitor, and a current source connected to said second voltage source and the connection between said detector diode and said second capacitor; and wherein said subtraction means comprises:

an operational amplifier having an inverting input and a non-inverting input, said second capacitor connected to said inverting input, a third voltage source connected to said non-inverting input, a third capacitor connected to said inverting input of said operational amplifier and an output of said operational amplifier, and a switch in parallel with said third capacitor, said switch when closed short-circuiting said third capacitor.

13. The control circuitry according to claim 1, wherein said current adjust means comprises:

an analog-to-digital converter connected to said subtraction means;

a processor connected to said analog-to-digital converter; and a digital-to-analog converter connected to said RF signal amplifier and said processor.

14. The control circuitry according to claim 1, further comprising:

a peak hold amplifier, an input of which is connected to said subtraction means; and a peak hold diode connected to the output of said peak hold amplifier and said current adjust means.

15. The control circuitry according to claim 14, further comprising:

a peak hold capacitor attached to the connection between said peak hold diode and said current adjust means.

16. The control circuitry according to claim 14, further comprising:

an isolating amplifier, an input of which is connected to said peak hold diode, an output of which is connected to said current adjust means.

17. The control circuitry according to claim 1, wherein a portion of said RF signal from said RF amplifier is diverted to said detection means, said RF signal portion being less than about −10 dB.

18. The control circuitry according to claim 17, wherein said RF signal portion is within the range of about −10 dB to about −40 dB.

19. The control circuitry according to claim 18, wherein said RF signal portion is within the range of about −15 dB to about −20 dB.

20. The control circuitry according to claim 1, wherein said given power level is maintained by said control circuitry at about a maximum FCC limitation for said telecommunications system.

21. The circuitry as set forth in claim 1, wherein said telecommunications system is a Time-Division Multiple Access system.

22. The circuitry as set forth in claim 1, wherein said telecommunications system is a Time-Division Duplex system.

23. A method for maintaining a radio frequency (RF) signal from an RF signal amplifier at a given power level in a telecommunications system, said method comprising the steps of:

detecting an initial voltage prior to receipt of said RF signal;

generating an output voltage after reception of said RF signal, said output voltage comprising the sum of said initial voltage and an RF voltage generated by said RF signal;

subtracting said initial voltage from said output voltage, leaving said RF voltage; and forwarding said RF voltage to said RF signal amplifier, maintaining said RF signal at said given power level in said telecommunications system.

* * * * *